(12) United States Patent
Morgenfeld et al.

(10) Patent No.: US 7,786,017 B1
(45) Date of Patent: Aug. 31, 2010

(54) UTILIZING INVERSE REACTIVE ION ETCHING LAG IN DOUBLE PATTERNING CONTACT FORMATION

(75) Inventors: Bradley J. Morgenfeld, Hopewell Juncion, NY (US); Scott D. Allen, Hopewell Junction, NY (US); Colin J. Brodsky, Hopewell Junction, NY (US); Wai-Kin Li, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/561,612

(22) Filed: Sep. 17, 2009

(51) Int. Cl.
*H01L 21/302* (2006.01)

(52) U.S. Cl. ............... 438/712; 438/199; 438/710; 438/714; 257/E21.246

(58) Field of Classification Search .......... 438/199, 438/710, 712, 714
See application file for complete search history.

(56) References Cited

U.S. PATENT DOCUMENTS

| | | | |
|---|---|---|---|
| 6,486,070 B1 | 11/2002 | Ho et al. | |
| 6,677,197 B2 * | 1/2004 | Kudelka et al. | 438/245 |
| 7,504,340 B1 | 3/2009 | Drizlikh et al. | |
| 2004/0023499 A1 | 2/2004 | Hellig et al. | |
| 2004/0241984 A1 * | 12/2004 | Schwan et al. | 438/637 |
| 2008/0188083 A1 | 8/2008 | Jeon et al. | |
| 2008/0268587 A1 * | 10/2008 | Sadaka et al. | 438/199 |
| 2009/0273030 A1 * | 11/2009 | Schrems et al. | 257/337 |
| 2010/0013515 A1 * | 1/2010 | Jung | 324/765 |

* cited by examiner

*Primary Examiner*—Alexander G Ghyka
(74) *Attorney, Agent, or Firm*—Wenjie Li; Hoffman Warnick LLC

(57) ABSTRACT

Solutions for solutions for utilizing Inverse Reactive Ion Etching lag in double patterning contact formation are disclosed. In one embodiment, a method includes providing a CMOS device including: an NMOS device having an NMOS gate and a PMOS device having a PMOS gate; a shallow trench isolation located between the NMOS device and the PMOS device; and an inter-level dielectric located over the NMOS device, the PMOS device and the shallow trench isolation; performing a double-patterning etch process on the CMOS device under conditions causing inverse reactive ion etching lag, the performing including forming a first opening, a second opening and a third opening, the second opening being wider than the first opening, and the third opening being contiguous with the second opening; and forming a first contact in the first opening and forming a second contact in both of the second opening and the third opening.

20 Claims, 15 Drawing Sheets

UTILIZING INVERSE REACTIVE ION ETCHING LAG IN DOUBLE PATTERNING CONTACT FORMATION

BACKGROUND OF THE INVENTION

The subject matter disclosed herein relates to solutions for utilizing inverse reactive ion etching (RIE) lag in double patterning contact formation. More specifically, the subject matter disclosed herein relates to forming a semiconductor device using a contact double patterning process with variable etch rates.

Fabricating highly integrated semiconductor devices involves using highly miniaturized patterns. As semiconductor devices have reduced in size, individual elements within the devices have become smaller. Particularly, as semiconductor fabrication has moved from the 45 nanometer process to the 32 nanometer process and below, double patterning techniques have been used in order to provide minimum pitch and critical dimensions through lithography processes. However, double patterning alone has not allowed for the controlled fabrication of contacts in certain semiconductor devices.

BRIEF DESCRIPTION OF THE INVENTION

Solutions for utilizing inverse reactive ion etching (RIE) lag in contact double patterning are disclosed. In one aspect, a method of forming a semiconductor structure is disclosed, the method comprising: depositing an inter-level dielectric layer over a CMOS device, the CMOS device including an NMOS device and a PMOS device; depositing a first photoresist over the inter-level dielectric layer; patterning a first opening in the first photoresist, and patterning a second opening in the first photoresist; etching the first photoresist and the inter-level dielectric layer under conditions causing inverse reactive ion etching lag, the etching including forming a first inter-level dielectric opening and a second inter-level dielectric opening corresponding to the first opening in the first photoresist and the second opening in the first photoresist, respectively; removing the first photoresist; depositing a first organic planarizing layer (OPL) over the inter-level dielectric layer, the depositing of the first OPL including filling the first inter-level dielectric opening and the second inter-level dielectric opening; depositing a second photoresist over the first OPL; patterning an opening in the second photoresist, the opening in the second photoresist located within the filled second inter-level dielectric opening; etching the second photoresist, the OPL, and the inter-level dielectric layer to form a third inter-level dielectric opening; and forming a contact in each of the first inter-level dielectric opening, the second inter-level dielectric opening, and the third inter-level dielectric opening.

A first aspect of the invention provides a method of forming a semiconductor structure, the method comprising: depositing an inter-level dielectric layer over a CMOS device, the CMOS device including an NMOS device and a PMOS device; depositing a first photoresist over the inter-level dielectric layer; patterning a first opening in the first photoresist, and patterning a second opening in the first photoresist; etching the first photoresist and the inter-level dielectric layer under conditions causing inverse reactive ion etching lag, the etching including forming a first inter-level dielectric opening and a second inter-level dielectric opening corresponding to the first opening in the first photoresist and the second opening in the first photoresist, respectively; removing the first photoresist; depositing a first organic planarizing layer (OPL) over the inter-level dielectric layer, the depositing of the first OPL including filling the first inter-level dielectric opening and the second inter-level dielectric opening; depositing a second photoresist over the first OPL; patterning an opening in the second photoresist, the opening in the second photoresist located within the filled second inter-level dielectric opening; etching the second photoresist, the OPL, and the inter-level dielectric layer to form a third inter-level dielectric opening; and forming a contact in each of the first inter-level dielectric opening, the second inter-level dielectric opening, and the third inter-level dielectric opening.

A second aspect of the invention provides a method of forming a double-patterned semiconductor structure comprising: forming a plurality of contacts in a CMOS device, the forming including: depositing an inter-level dielectric layer over the CMOS device; depositing a first photoresist over the inter-level dielectric layer; patterning a first opening in the first photoresist, and patterning a second opening in the first photoresist; etching the first photoresist and the inter-level dielectric layer under conditions causing inverse reactive ion etching lag, the etching including forming a first inter-level dielectric opening and a second inter-level dielectric opening corresponding to the first opening in the first photoresist and the second opening in the first photoresist, respectively; removing the first photoresist; depositing a first organic planarizing layer (OPL) over the inter-level dielectric layer, the depositing of the first OPL including filling the first inter-level dielectric opening and the second inter-level dielectric opening; depositing a second photoresist over the OPL; patterning an opening in the second photoresist, the opening in the second photoresist located within the filled second inter-level dielectric opening; etching the second photoresist, the OPL, and the inter-level dielectric layer to form a third inter-level dielectric opening, the third inter-level dielectric opening being contiguous with the second inter-level dielectric opening and narrower than the second inter-level dielectric opening; and forming a contact in each of the first inter-level dielectric opening, the second inter-level dielectric opening, and the third inter-level dielectric opening.

A third aspect of the invention provides a method of forming contacts in a CMOS device, the method comprising: providing the CMOS device including: providing the CMOS device including: an NMOS device having an NMOS gate and a PMOS device having a PMOS gate; a shallow trench isolation located between the NMOS device and the PMOS device; and an inter-level dielectric located over the NMOS device, the PMOS device and the shallow trench isolation; performing a double-patterning etch process on the CMOS device under conditions causing inverse reactive ion etching lag, the performing including forming a first opening, a second opening and a third opening, the second opening being wider than the first opening, and the third opening being contiguous with the second opening; and forming a first contact in the first opening and forming a second contact in both of the second opening and the third opening.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As used herein, the term "deposition" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 1:
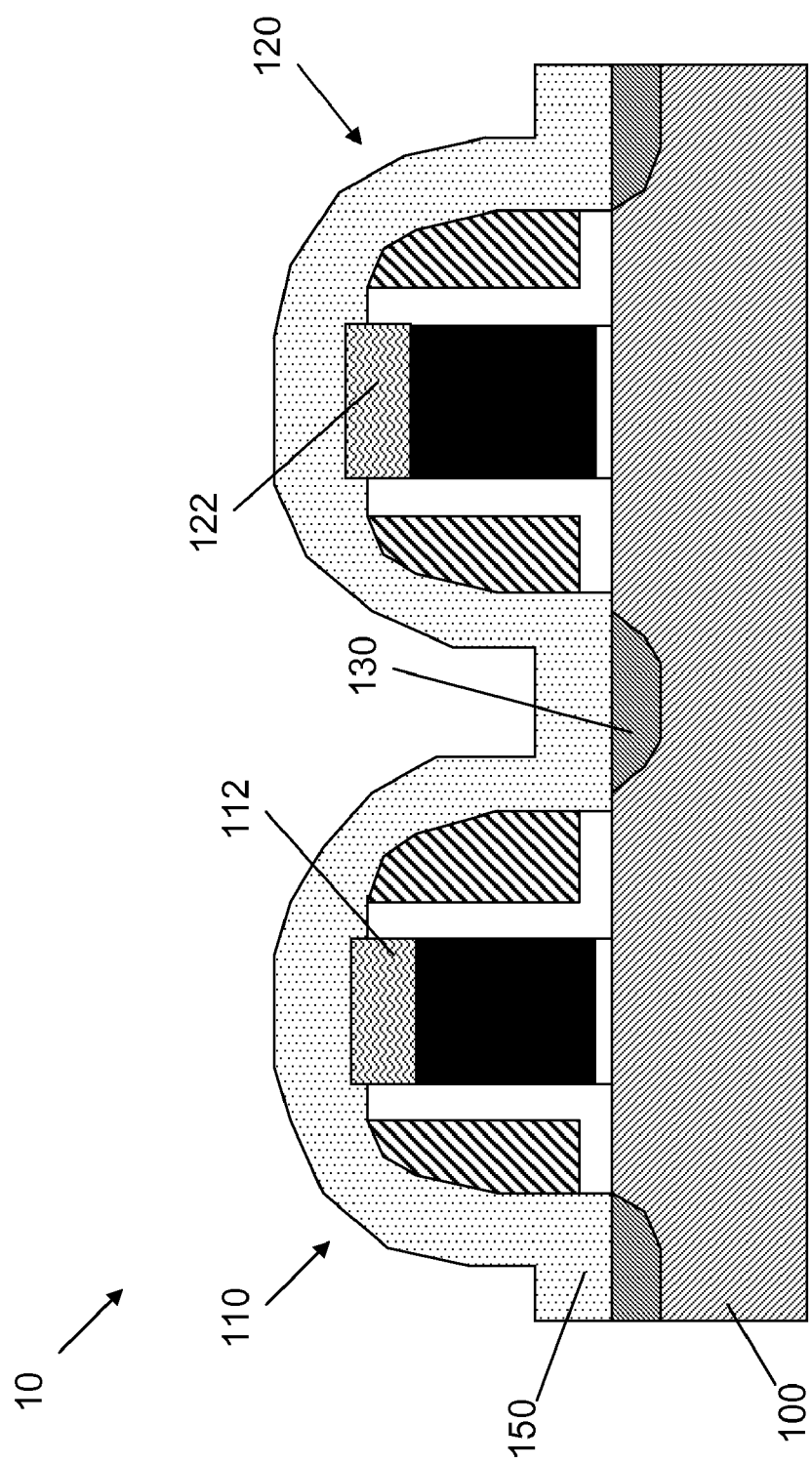
FIGS. 1-12 show cross-sectional views of steps in forming a semiconductor structure according to embodiments of the invention.

Turning to the figures, a method of forming a semiconductor structure is shown in FIGS. 1-11. In particular, a method of forming a semiconductor structure utilizing inverse reactive ion etching (RIE) lag in contact double patterning is shown. FIG. 1 shows a complimentary metal oxide semiconductor (CMOS) device 10 including an N-type metal oxide semiconductor (NMOS) device 110 and a P-type metal oxide semiconductor (PMOS) device 120. As is known in the art, the term "MOS" device refers to a metal oxide semiconductor field effect transistor (MOSFET). As used herein, the term "MOS" device refers to various forms of MOSFETs. CMOS device 10 of FIGS. 1-15 may be formed in any conventional manner, such as by methods including deposition, etching and/or growth techniques known in the art. CMOS device 10 may include a substrate 100, NMOS device 110, PMOS device 120, and a shallow trench isolation (STI) 130 located between NMOS device 110 and PMOS device 120. As is known in the art, STI 130 may prevent leakage of electrical current between NMOS device 110 and PMOS device 120. STI 130 may be formed prior to NMOS device 110 and PMOS device 120, and may include a dielectric material such as silicon dioxide. NMOS device 110 may include an NMOS gate 112, and PMOS device 120 may include a PMOS gate 122. NMOS gate 112 and PMOS gate 122 may each provide points of contact for layers formed over CMOS device 10 (not shown). Further, a stress liner 150 may be provided over CMOS device 10, but is not necessary. In one embodiment, stress liner 150 may be formed of a tensile or compressively stressed nitride. In any case stress liner 150 may be formed over CMOS device 10 in any conventional manner.

Figure 2:
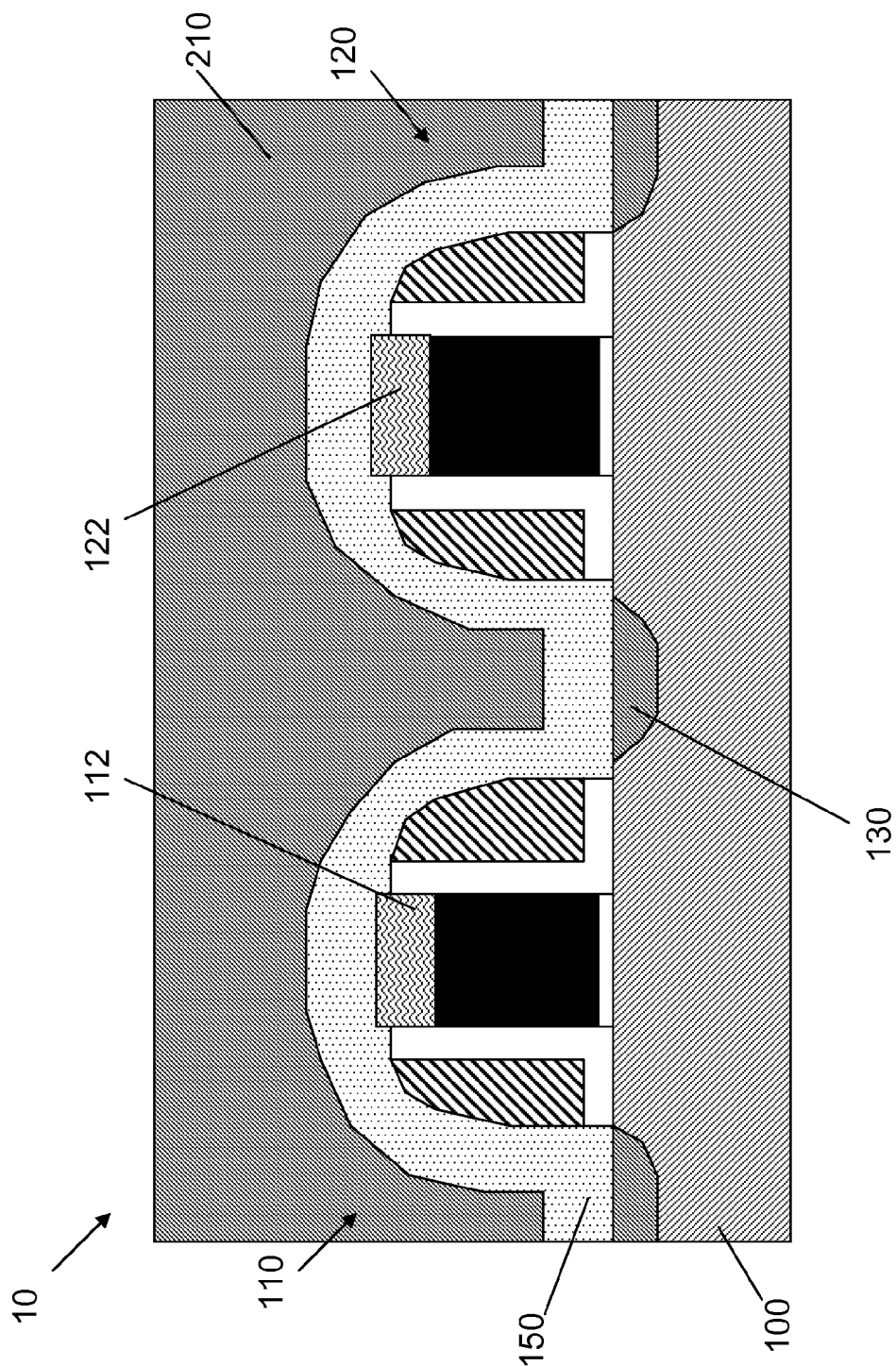

FIG. 2 shows an inter-level dielectric layer (ILD) 210 deposited over CMOS device 10 according to one embodiment of the invention. ILD 210 may be deposited over CMOS device 10 in any conventional manner, such as those described herein. For example, ILD 210 may be deposited using CVD or PECVD techniques known in the art. ILD 210 may insulate portions of CMOS device 10 from other portions of a circuit or array (not shown).

Figure 3:
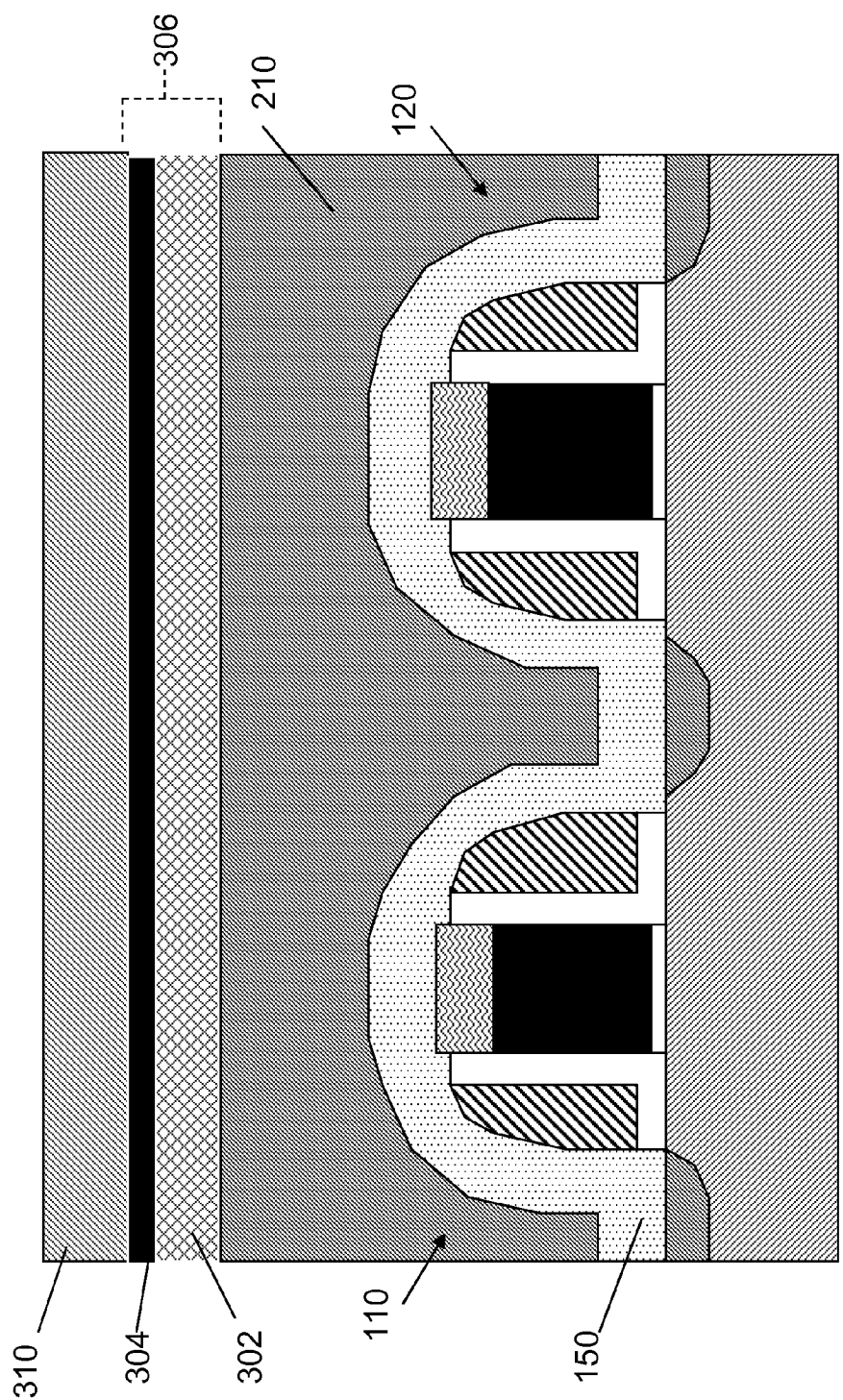

FIG. 3 shows an organic planarizing layer (OPL) 302 deposited over ILD 210 according to one embodiment of the invention. OPL 302 may include any material capable of planarizing ILD 210, such as, for example, those described in U.S. Pat. No. 6,927,015. OPL 302 may be deposited over ILD 210 via a variety of methods known in the art. For example, OPL 302 may be deposited over ILD 210 by coating and printing. However, many other deposition techniques are possible as is known in the art. OPL 302 may help to planarize topological features of ILD 210, and may enhance later exposure, etching, and deposition steps in forming of a double-patterning contact. FIG. 3 further shows an etch stop layer 304 deposited over OPL 302. In one embodiment, etch stop layer 304 may be a silicon layer containing an anti-reflective coating (SiARC). In this case, etch stop layer 304 may be formed of any silicon-containing anti-reflective coating, such as, for example, silicon nitride, silicon-rich silicon nitride, silicon oxynitride, etc. Etch stop layer 304 may be deposited in any conventional manner known in the art or described herein. For example, etch stop layer 304 may be spun-on using a polymeric material, deposited by CVD, PECVD, or sputtering. However, etch stop layer 304 may be deposited in any conventional manner known in the art or described herein.

In an alternative embodiment (shown in phantom), an organic bottom anti-reflective coating (organic BARC) layer 306 may be deposited over ILD 210 (instead of OPL 302 and etch stop layer 304). Organic BARC layer 306 may act both as an anti-reflective coating and as a planarizing layer, therefore performing some of the functions of both OPL 302 and etch stop layer 304 described herein. Organic BARC layer 306 may be deposited, for example, by CVD, PECVD, sputtering, or spun-on using a polymeric material. However, organic BARC layer 306 may also be deposited in any conventional manner known in the art or described here. While utilizing inverse RIE lag in contact double-patterning is described and depicted herein using OPL 302 and etch stop layer 304, it is understood that organic BARC layer 306 may be substituted for OPL 302 and etch stop layer 304 without substantially altering the processes steps.

Also shown in FIG. 3 is first photoresist 310 deposited over etch stop layer 304 (or alternatively, organic BARC layer 306) according to one embodiment of the invention. First photoresist 310 may be formed of any light-sensitive chemical capable of forming a desired pattern when exposed to light. First photoresist 310 may be deposited on ILD 210 by, for example, spin coating and baking. As is known in the art, spin coating may include dispensing a thin solution of first photoresist 310 onto ILD 210 while CMOS device 10 is spun at a rate of speed which may range from 1200 to 4800 rpm. After spin coating, first photoresist 310 may be baked at a temperature ranging, for example, from 90-100 degrees Celsius to remove any excess solution, leaving a substantially planarized first photoresist 310. While spin coating and baking are described herein with reference to depositing photoresist 310, it is understood that first photoresist 310 may be deposited using any other conventional methods.

Figure 4:
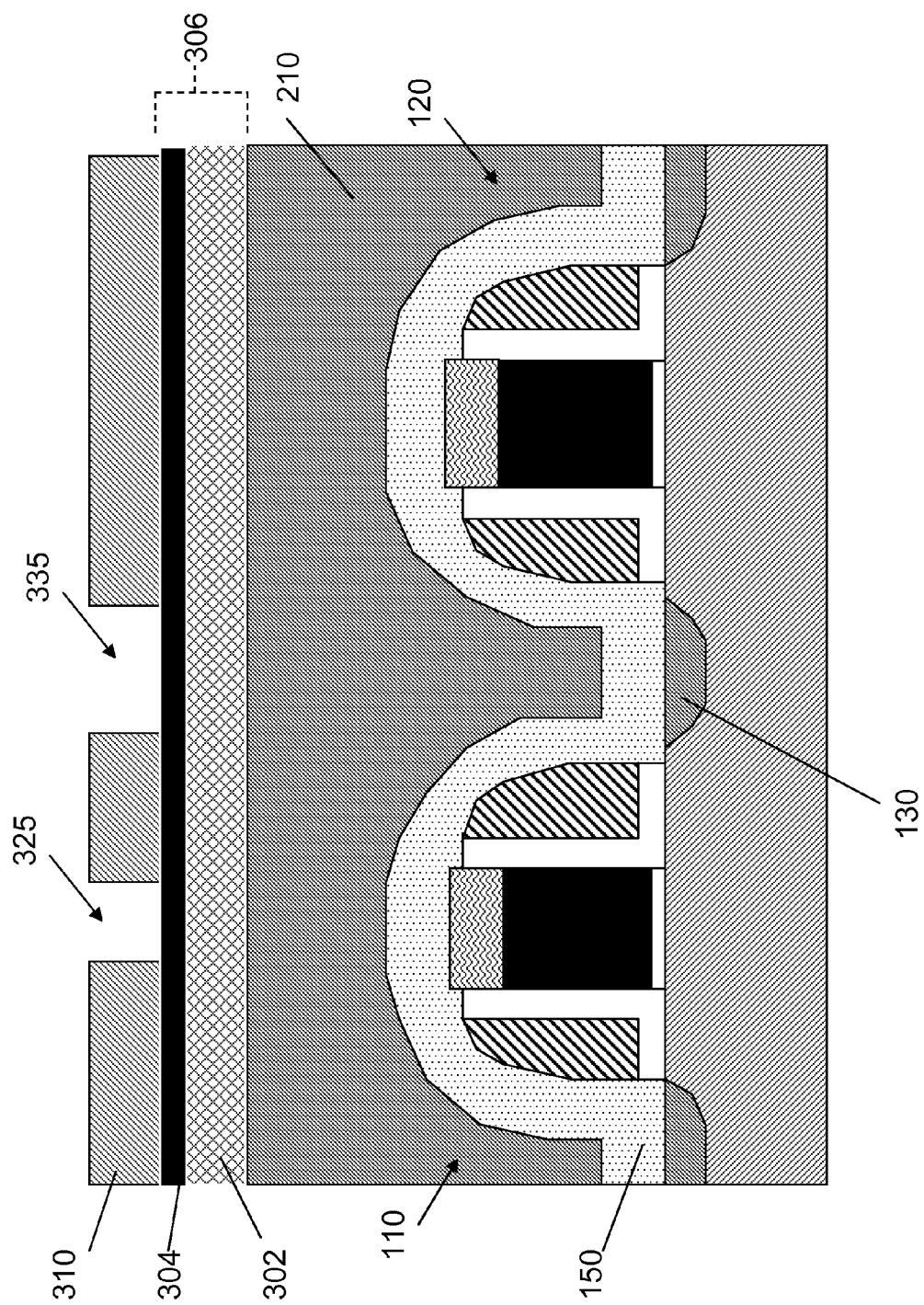

FIG. 4 shows patterning of a first opening 325 and patterning of a second opening 335 in first photoresist 310. Patterning may include using a photomask (not shown) to shield portions of first photoresist 310 from a light source (e.g., ultraviolet light). When exposed portions of first photoresist 310 are subjected to the light source, those portions are made soluble. The soluble portions of first photoresist 310 may then be removed using, for example, a developer solution. Removing the soluble portions of first photoresist 310 forms a pattern in first photoresist 310 that may be used in future etching processes. After forming a pattern in photoresist 310, the hardmask may be removed. In the cross-sectional view of CMOS device 10 of FIG. 4, the pattern formed in first photoresist 310 includes first opening 325 and second opening 335. In this case, second opening 335 may be wider than first opening 325, and second opening 335 may be aligned with STI 130. First opening 325 may be aligned with one of NMOS gate 112 or PMOS gate 122.

Figure 5:
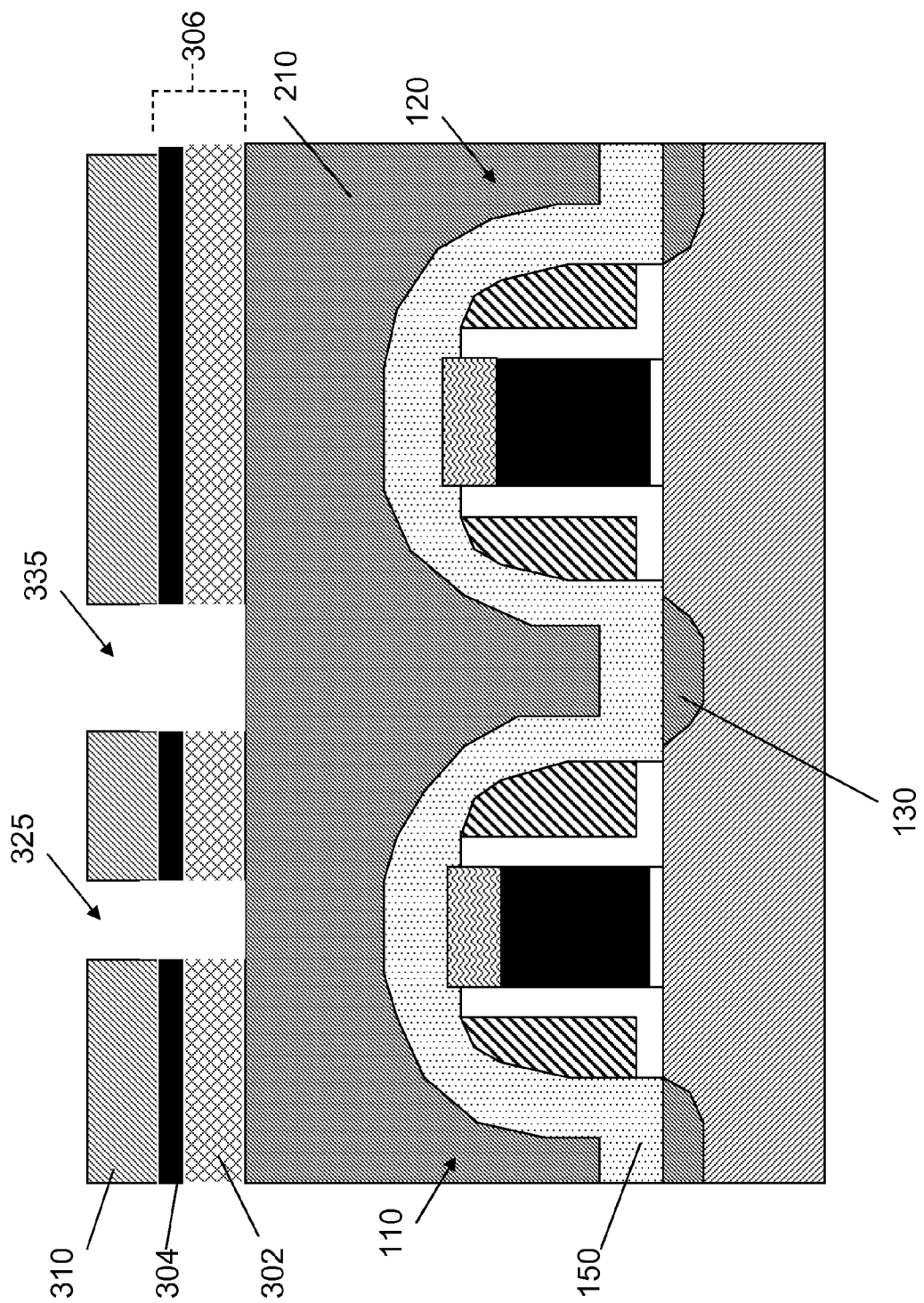

FIG. 5 shows CMOS device 10 after an optional intermediate step of etching etch stop layer 304 and OPL 302 (or alternatively, organic BARC layer 306) such that first opening 325 and second opening 335 abut ILD 210. In this case, etching of etch stop layer 304 and OPL 302 may be performed using reactive ion etching (RIE), which is described in greater detail with reference to FIG. 6. However, etching of etch stop layer 304 and OPL 302 may also be performed by other conventional techniques known in the art or described herein. Etching etch stop layer 304 and OPL 302 in a different process step than etching of ILD 210 (described below) may provide for better processing control and etch accuracy.

Figure 6:
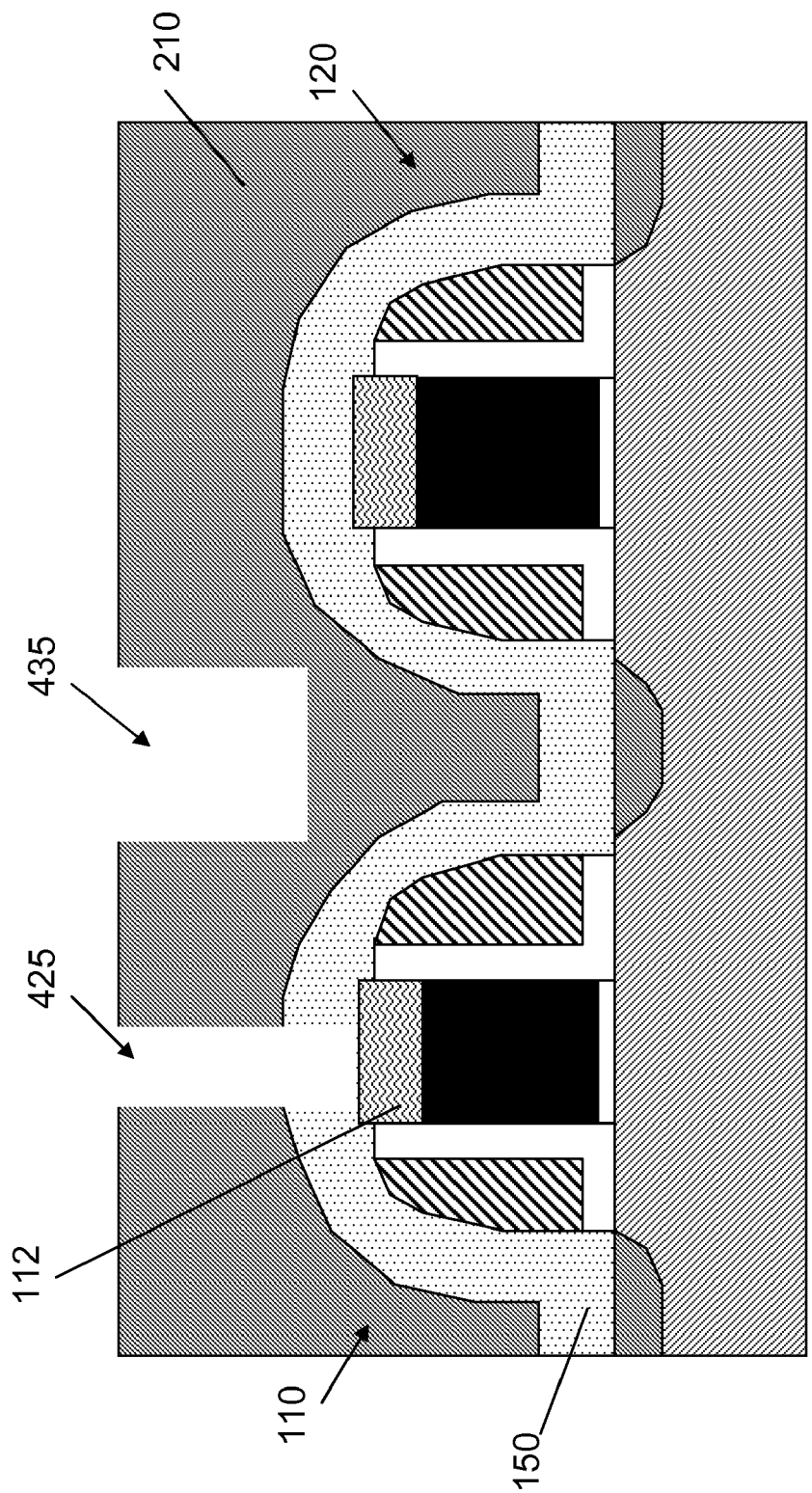

FIG. 6 shows CMOS device 10 after performing of a reactive ion etch (RIE) of first photoresist 310, etch stop layer 304, OPL 302 and ILD 210. As described herein, etching of ILD 210 may be performed in the same step or a separate step from etching of etch stop layer 304 and OPL 302. In any case, etching of ILD 210 is performed using RIE. As is known in the art of semiconductor fabrication, RIE uses chemically reactive plasma to remove material deposited on wafers. RIE of first photoresist 310, etch stop layer 304, OPL 302 and ILD 210 may form a first ILD opening 425 and a second ILD opening 435. First ILD opening 425 corresponds to first opening 325, and second ILD opening 435 corresponds to second opening 335. As shown in FIGS. 4-5, second opening 335 may be wider than first opening 325. Similarly, second ILD opening 435 may be wider than first ILD opening 425. Differences in width between these openings may allow for utilizing a phenomenon known as inverse RIE lag. Inverse RIE lag, as is known in the art of semiconductor fabrication, causes a faster etch rate in narrower openings (higher aspect ratios) than in openings having larger widths (lower aspect ratios). Inverse RIE lag may be induced under any conditions characterized by high polymerization and high wafer self-bias voltages. In one embodiment, conditions characterized by high polymerization, may include general chemistries such as CxHyFz (Carbon-Hydrogen-Flourine) with high oxide-to-nitride selectivity (where the blanket etch rate ratio is greater than approximately 20:1). In another embodiment, conditions characterized by high polymerization may include O2 (oxygen), a dilutant, and one or more of: C4F6, C5F8, or C4F8. In this case, the dilutant may be, for example, Argon (Ar). High wafer self-bias voltages may, for example, be voltages greater than approximately 500 volts. While specific conditions for facilitating inverse RIE lag are described herein, those conditions are merely illustrative. Inverse RIE lag may be induced under other conditions not specifically described herein.

Inverse RIE lag allows for faster etching of first ILD opening 425 than second ILD opening 435 due to their different aspect ratios. In this case, first ILD opening 425 may extend to contact NMOS device 110 and abut NMOS gate 112. This allows for forming of a contact (not shown) with NMOS gate 112. During the same process, second ILD opening 435 is formed at a lesser depth than first ILD opening 425. This may prevent, for example, over-etching of second ILD opening 435 into stress liner 150 of NMOS device 110 and/or PMOS device 120. FIG. 6 further shows CMOS device 10 with first photoresist 310 removed. Photoresist 310 may be removed using, for example, a conventional resist stripper. A resist stripper, as is known in the art of semiconductor fabrication, may chemically alter photoresist 310 such that it no longer adheres to ILD 210. Photoresist 310 may alternatively be removed by oxidation, using a plasma. However, photoresist 310 may be removed using any conventional techniques known in the art of semiconductor fabrication. Etch stop layer 304, OPL 302 may also be removed using techniques known in the art or described herein.

Figure 7:
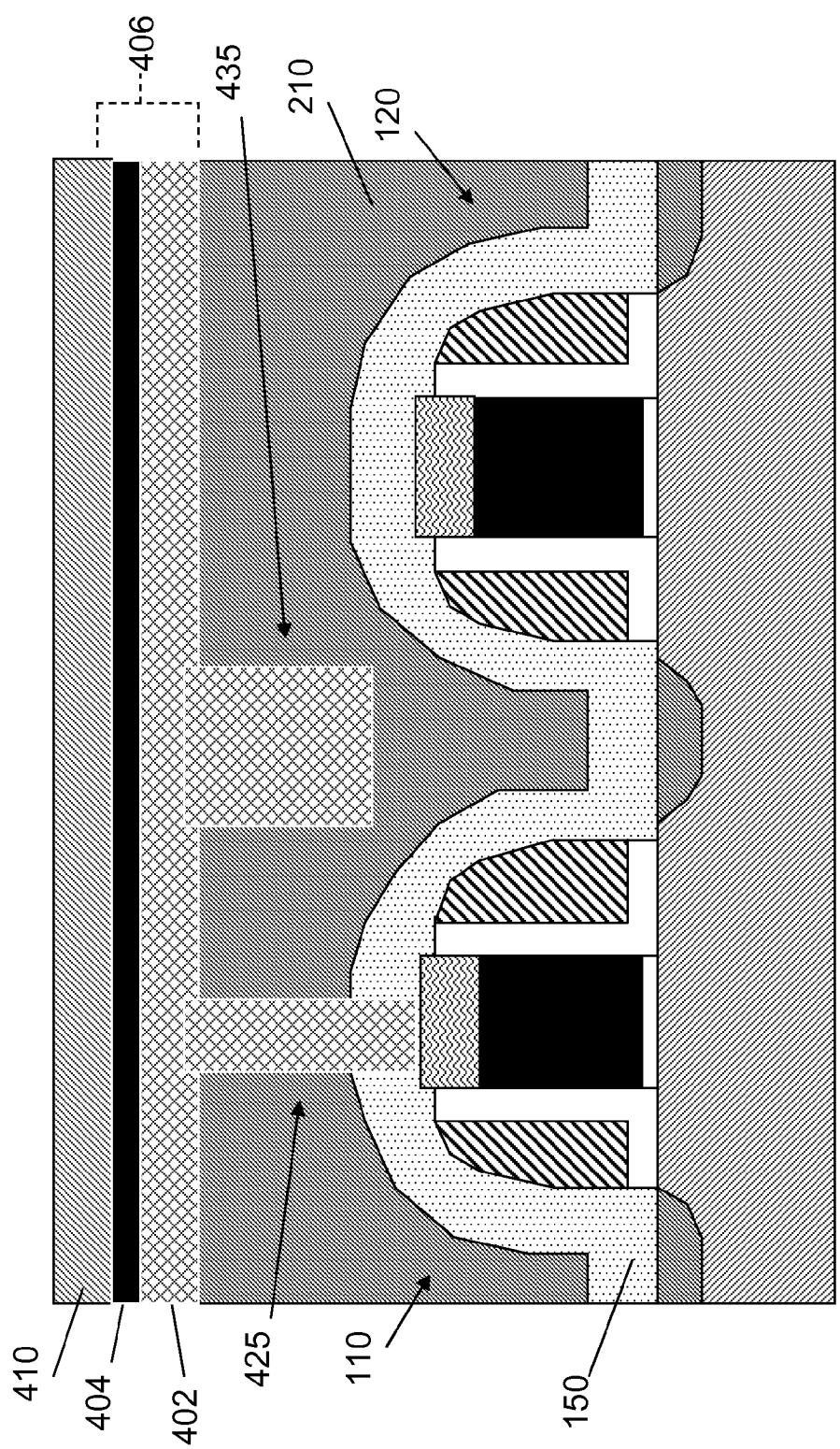

FIG. 7 shows CMOS device 10 of FIG. 6 after deposition of a second organic planarizing layer (second OPL) 402 over ILD 210, a second etch stop layer 404 and a second photoresist 410 over second etch stop layer 404. In this case, depositing of second OPL 402 fills first ILD opening 425 and second ILD opening 435 (FIG. 5). Depositing of second OPL 402, second etch stop layer 404 and second photoresist 410 may be performed substantially similarly to deposition of OPL 302, etch stop layer 304 and first photoresist 310, or may be performed using other conventional deposition techniques. Further, second etch stop layer 404 and second photoresist 410 may be formed of substantially similar materials as etch stop layer 304 and photoresist 310, respectively. In an alternative embodiment, a second organic BARC layer 406 may be deposited over ILD 210 instead of second OPL 402 and second etch stop layer 404. Second organic BARC layer 406 may be deposited substantially similarly to organic BARC layer 306, shown and described with reference to FIG. 3.

Figure 8:
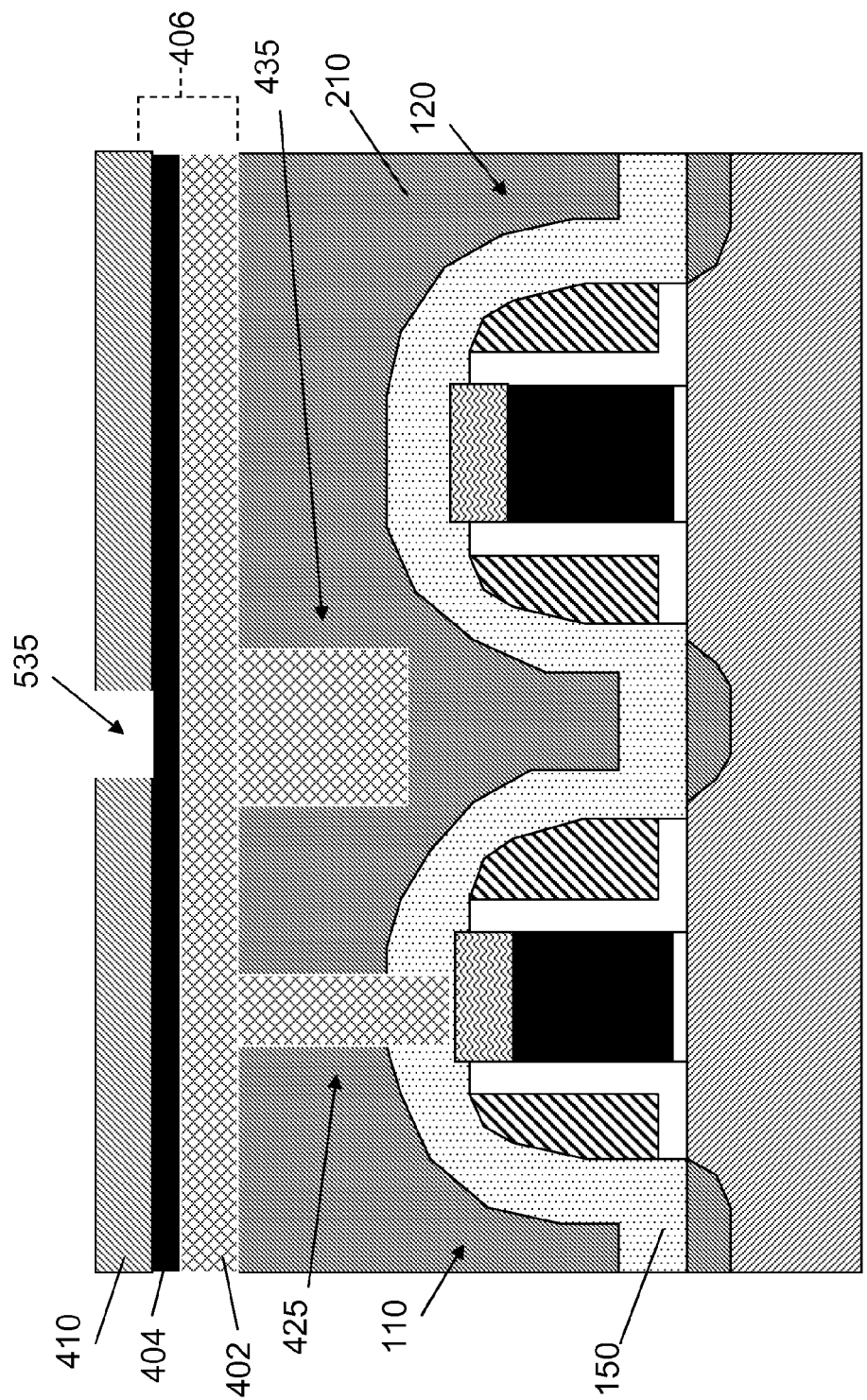

FIG. 8 shows CMOS device 10 of FIG. 6 after a second photoresist opening 535 has been patterned in second photoresist 410. Patterning of second photoresist opening 535 may be performed substantially similarly to the patterning of first opening 325 and second opening 335 in first photoresist 310. In one embodiment, second photoresist opening 535 is located over filled second ILD opening 435. In this case, second photoresist opening 535 may be narrower than second ILD opening 435.

Figure 9:
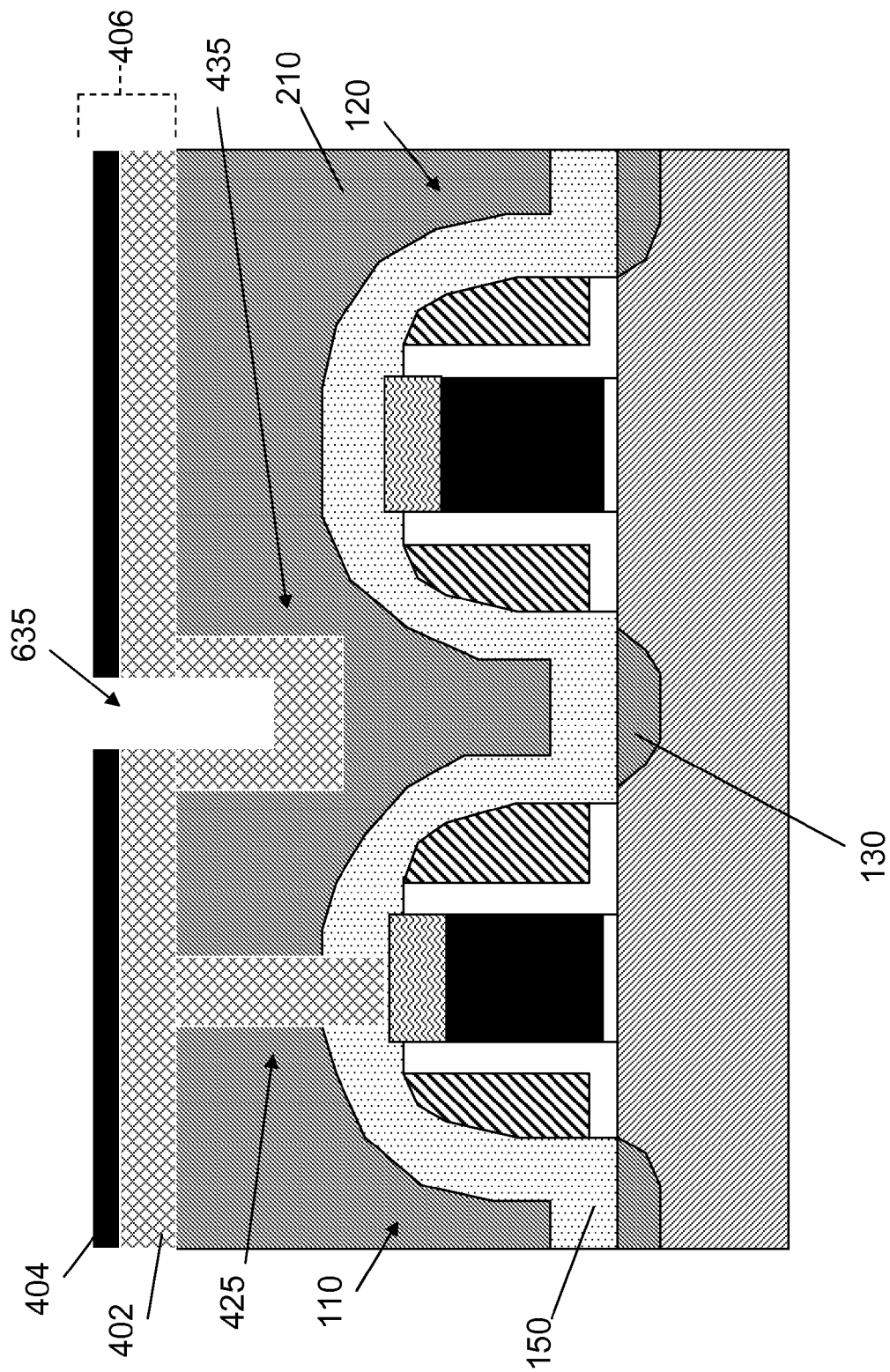

FIG. 9 shows CMOS device 10 of FIG. 7 after etching of second etch stop layer 404 and second OPL 402 and removal of second photoresist 410 (FIG. 7). Using photoresist 410 (FIG. 6) as a shield, a reactive ion etch (RIE) of second etch stop layer 404 and second OPL 402 may be performed. The RIE of second etch stop layer 404 and second OPL 402 may be performed in a substantially similar manner to the RIE process of ILD 210. Further, similar RIE conditions may be used in the RIE of second etch stop layer 404 and second OPL 402 as in the RIE of ILD 210. The RIE of second etch stop layer 404 and second OPL 402 may create an opening 635 in second OPL 402 within opening 435. Opening 635 may be narrower than second ILD opening 435 (FIG. 5), and may be aligned with second ILD opening 435 and STI 130. Second photoresist 410 may be removed in a substantially similar manner as first photoresist 310, for example, using a resist stripper.

Figure 10:
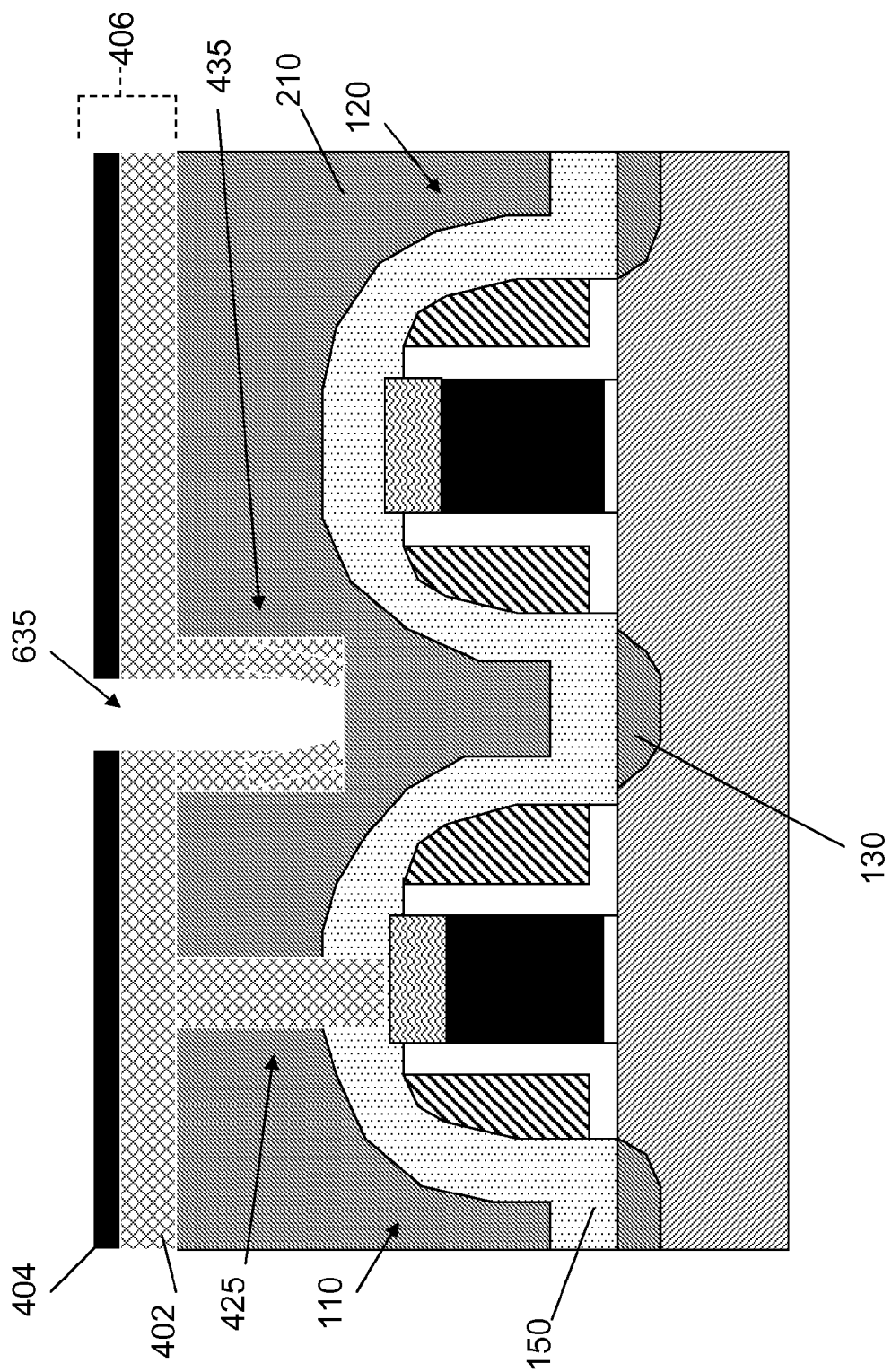

FIG. 10 shows CMOS device 10 of FIG. 8 after further etching of opening 635. Opening 635 may be further etched through OPL 402 to abut ILD 210. Process conditions may be adjusted during RIE to allow for increased or decreased tapering of opening 635. Etching steps shown in FIGS. 9-10 may be performed at separate intervals, or may be performed substantially simultaneously. In any case, RIE of second OPL 402 may form opening 635 that abuts ILD 210.

Figure 11:
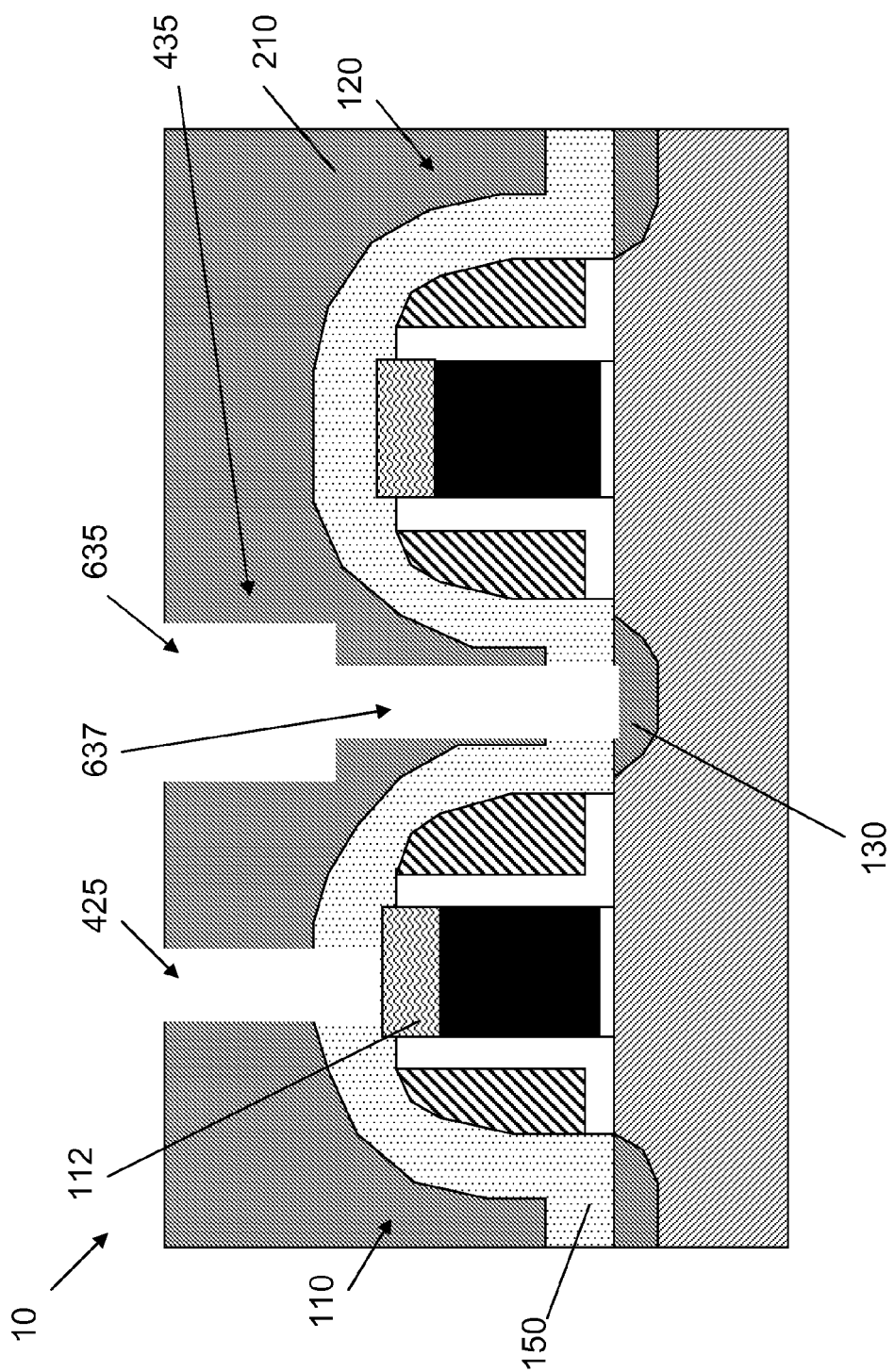

FIG. 11 shows CMOS device 10 of FIG. 10 after further etching of opening 635 into ILD 210 and removal of second OPL 402 to form a third inter-level dielectric opening 637. Third ILD opening 637 may be etched into ILD 210 using a RIE process similar to those described with reference to FIG.

5. Third ILD opening 637 may extend to STI 130, and may provide for forming of a contact (not shown) with STI 130. Third ILD opening 637 may be contiguous with second ILD opening 435, allowing for forming of one contiguous contact. Further shown in FIG. 11, second OPL 402 has been removed from first ILD opening 425. First ILD opening 425 may provide for forming of a contact (not shown) with NMOS gate 112.

Figure 12:
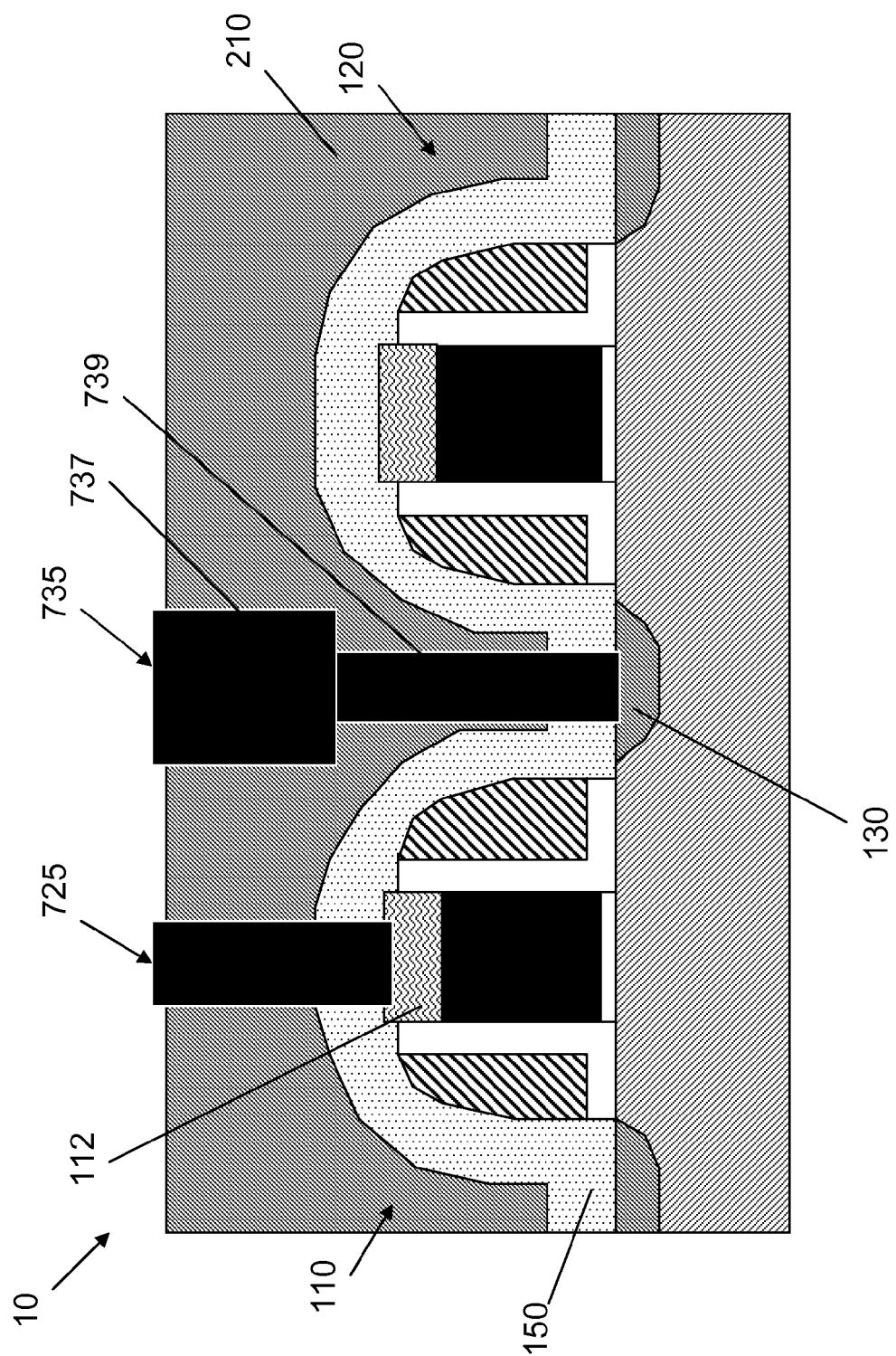

FIG. 12 shows the forming of a plurality of contacts 725, 735 in first ILD opening 425, opening 625 and third ILD opening 637. Forming of contacts 725, 735 may include depositing a conductive metal such as copper in first ILD opening 425, opening 625 and third ILD opening 637, and planarizing a surface thereof after the depositing, e.g., by chemical mechanical polishing (CMP). However, other conductive metals may be deposited in first ILD opening 425, opening 625 and third ILD opening 637 to form contacts 725, 735. Conventional deposition techniques may be used to deposit conductive metal in ILD opening 425, opening 625 and third opening 635. These techniques may include CVD, PECVD, or other suitable deposition techniques described herein or known in the art. As is known in the art of semiconductor fabrication, contacts 725, 735 may provide electrical connection between NMOS device 110, PMOS device 112, STI 130 and other portions of a circuit or array of semiconductor chips (not shown). While contact 725 is shown including a via (vertical connection between layers), contact 735 may include a via 739 and a plug 737.

Figure 13:
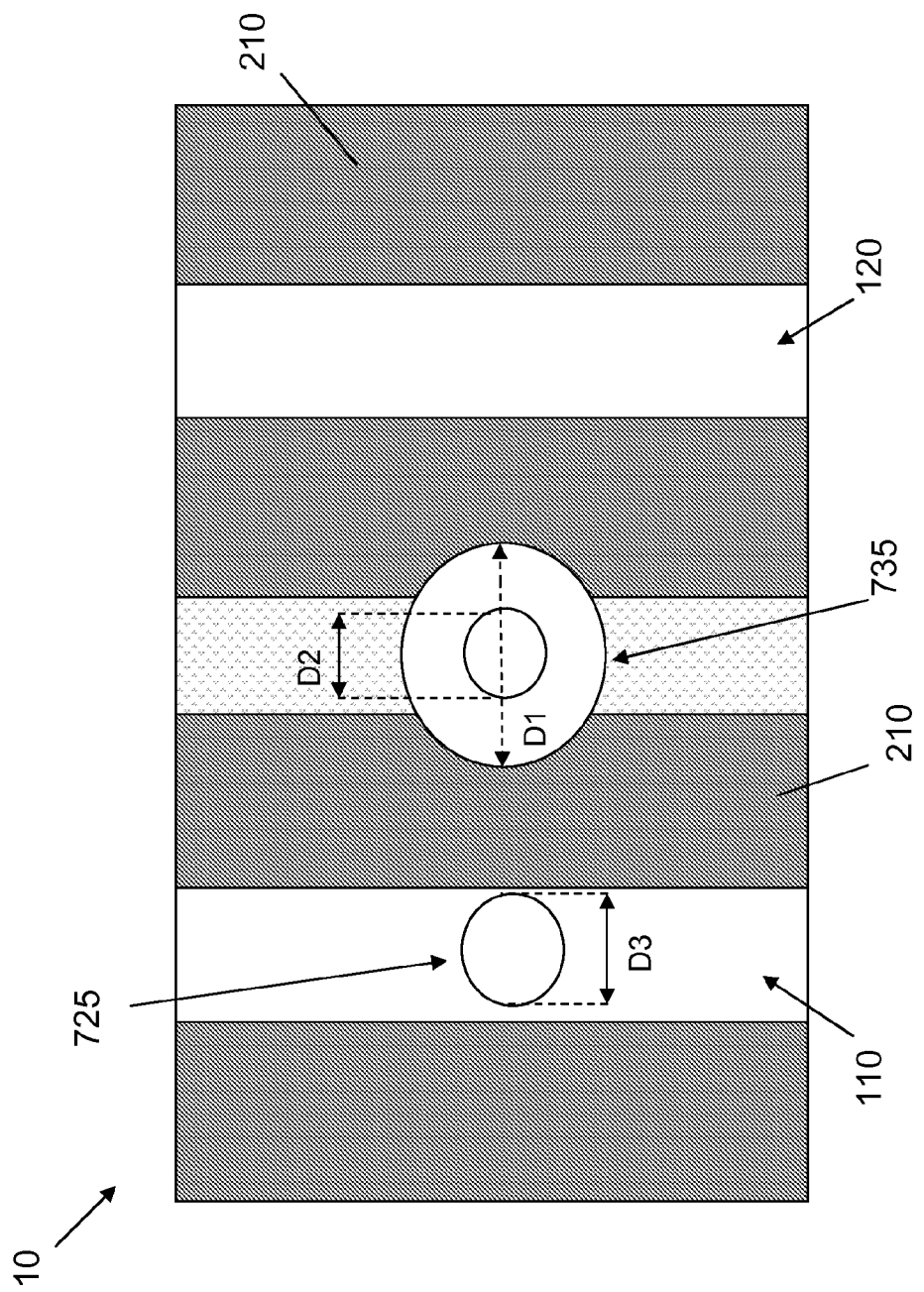
FIG. 13 shows a top view of a semiconductor structure according to embodiments of the invention.

FIG. 13 shows a top view of CMOS device 10 of FIG. 12. As shown, contact 735 is wider than contact 725. Contact 735 may include plug 737 with a diameter D1, and via 739 (FIG. 12) with a diameter D2. Contact 725 may have a diameter D3. In one embodiment, D1 is larger than D3, and D3 is larger than or equal in size with D2. However, diameter D2 may not be larger than D3 because such geometry would increase the risk of shorting between gate 112 and contact 725. In one embodiment, D3 is between approximately zero and twenty percent larger than D2 (ratios between 1:1 and 1.2:1). In any case, D1 is larger than D3, as this allows for inverse RIE lag to form contacts 725, 735 as described herein.

Figure 14:
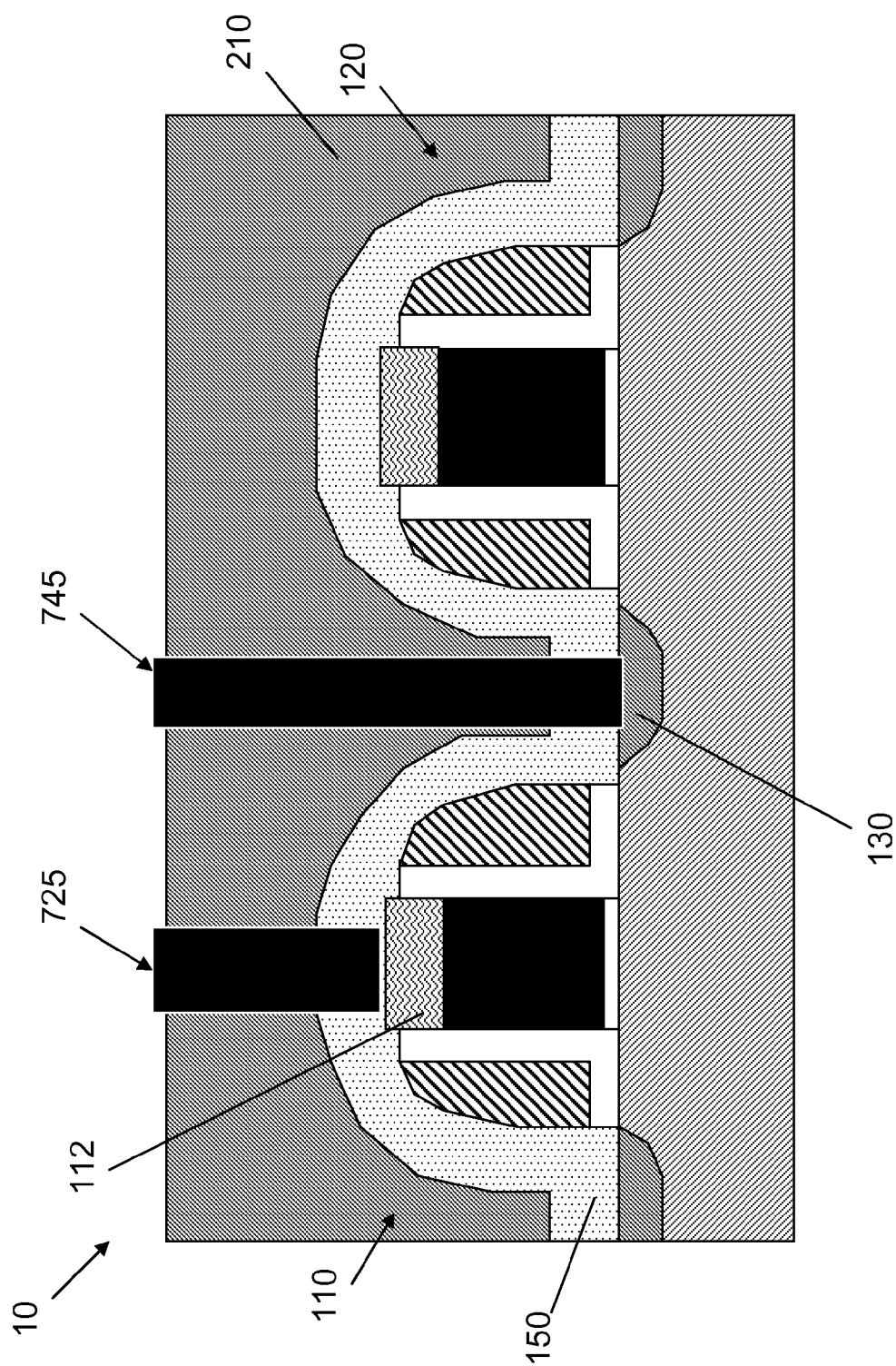
FIG. 14 shows a cross-sectional view of a semiconductor structure according to one embodiment of the invention.
Figure 15:
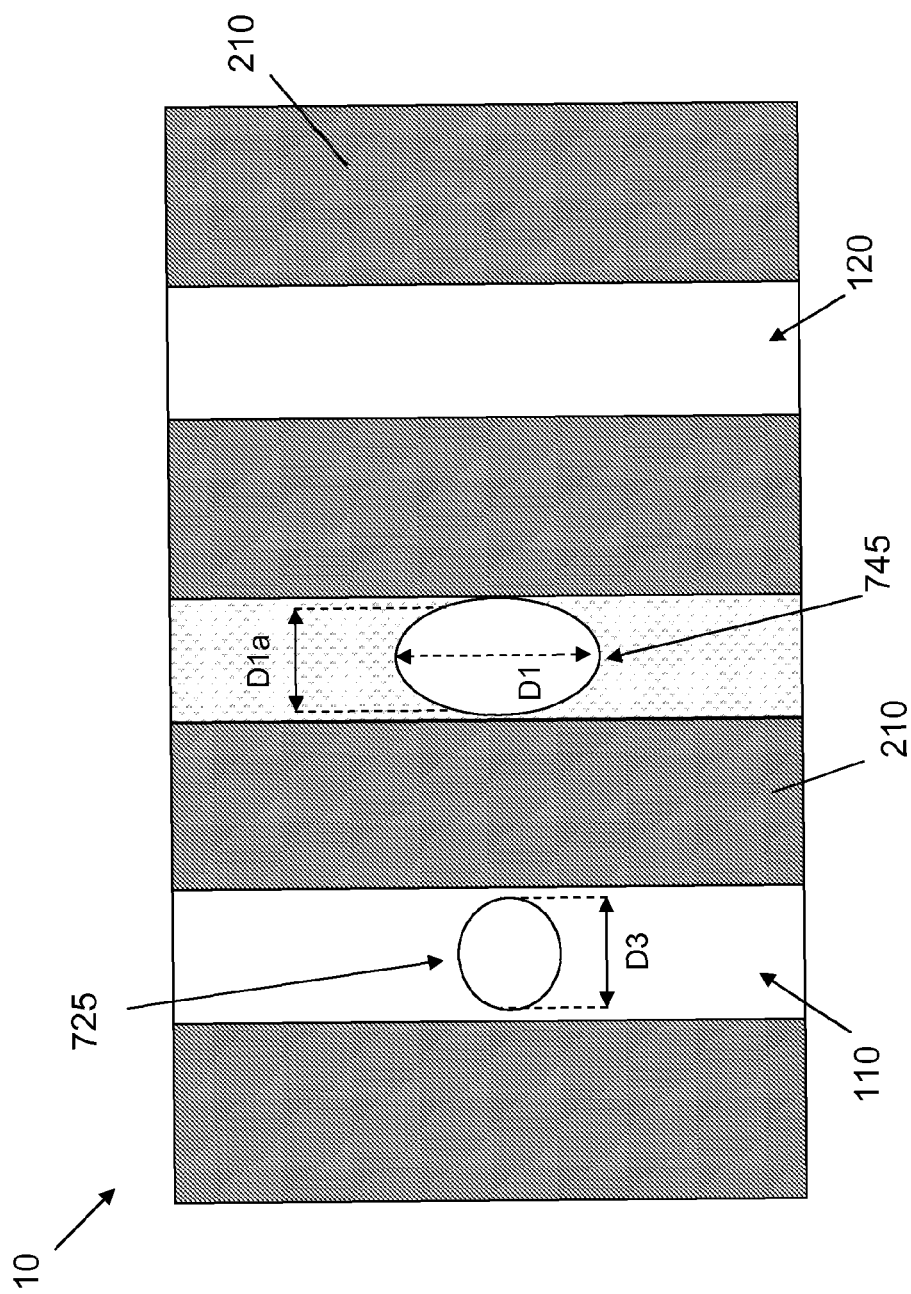
FIG. 15 shows a top view of the semiconductor structure of FIG. 14.

FIG. 14 shows an alternative embodiment of CMOS device 10 whereby a contact 745 is formed in place of contact 735 of FIG. 11. In one embodiment, contact 745 may include one vertical connection with STI 130, and may be formed using RIE as described with respect to the forming of contacts 725, 735. However, forming of via contact 745 may differ from forming of via contact 735 in that via contact 745 may be formed using a second ILD opening 435 that is wider than first ILD opening 425 in only one direction. This may result in via contact 745 having an elliptical shape when viewed from a top perspective (FIG. 15). In contrast, as shown in FIG. 13, contact 735 has a substantially circular shape when viewed from a top perspective. In another embodiment, via contact 745 may include a via and a plug (numbering omitted). In this case, the plug portion of via contact 745 may have a substantially elliptical shape (FIG. 15), while the via portion of via contact 745 may have a substantially circular shape.

Turning to FIG. 15, a top perspective view of CMOS device 10 of FIG. 14 is shown. In this embodiment, contact 725 may have substantially the same diameter D3 as described with reference to FIG. 13. However, contact 745 may have a substantially elliptical shape characterized by a major diameter D1 and a minor diameter D1a. Major diameter D1 may be larger than minor diameter D1a by an order of magnitude that complies with device design. Via contact 745 may be formed by etching a substantially elliptical opening in ILD 210 (depiction omitted). In one embodiment, the substantially elliptical opening may be used to form the entire portion of via contact 745 (using inverse RIE lag). In another embodiment, via contact may include a plug and a via (numbering omitted). In this case, the substantially elliptical opening may be used to form the plug portion, while a substantially circular opening is used to form the via portion. In any case, utilizing inverse RIE lag, the substantially elliptical opening in ILD 210 etches at a slower rate than etching of first ILD opening 425 (FIG. 5). This phenomenon may occur similarly as described with reference to FIG. 5. In one embodiment, minor diameter D1a may be substantially equal to D3, such that only major diameter D1 controls the extent to which inverse RIE lag occurs in forming via contact 745. In this case, the etch rate of the opening in which via contact 745 is created may be controlled by the size of major diameter D1. In any case, minor diameter D1a may not be larger than D3 because such geometry would increase the risk of shorting between gate 112 and contact 725. As shown and described herein, inverse RIE lag allows for contacting of NMOS device 110 and STI 130 without over-etching into stress liner 150.

The methods and structures as described above are used in the fabrication of semiconductor chips. The resulting semiconductor chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming a semiconductor structure, the method comprising:
   depositing an inter-level dielectric layer over a CMOS device, the CMOS device including an NMOS device and a PMOS device;
   depositing a first photoresist over the inter-level dielectric layer;
   patterning a first opening in the first photoresist, and patterning a second opening in the first photoresist;
   etching the first photoresist and the inter-level dielectric layer under conditions causing inverse reactive ion etching lag, the etching including forming a first inter-level dielectric opening and a second inter-level dielectric opening corresponding to the first opening in the first photoresist and the second opening in the first photoresist, respectively;
   removing the first photoresist;
   depositing a first organic planarizing layer (OPL) over the inter-level dielectric layer, the depositing of the first OPL including filling the first inter-level dielectric opening and the second inter-level dielectric opening;
   depositing a second photoresist over the first OPL;
   patterning an opening in the second photoresist, the opening in the second photoresist located within the filled second inter-level dielectric opening;
   etching the second photoresist, the OPL, and the inter-level dielectric layer to form a third inter-level dielectric opening; and
   forming a contact in each of the first inter-level dielectric opening, the second inter-level dielectric opening, and the third inter-level dielectric opening.

2. The method of claim 1, wherein the third inter-level dielectric opening is narrower than the second inter-level dielectric opening.

3. The method of claim 1, wherein the opening in the second photoresist is narrower than the second inter-level dielectric opening.

4. The method of claim 1, wherein the etching of the second photoresist is performed under conditions causing inverse reactive ion etching lag.

5. The method of claim 1, wherein the CMOS device further includes:
   a shallow trench isolation located between the NMOS device and the PMOS device, wherein the first opening is aligned with one of the NMOS gate or the PMOS gate.

6. The method of claim 5, wherein the third inter-level dielectric opening contacts the shallow trench isolation.

7. The method of claim 5, wherein the first inter-level dielectric opening contacts the NMOS gate.

8. The method of claim 5, wherein the second opening is wider than the first opening and is aligned with the shallow trench isolation.

9. The method of claim 1, wherein the third inter-level dielectric opening is contiguous with the second inter-level dielectric opening.

10. The method of claim 1, further comprising:
    depositing a second organic planarizing layer (second OPL) over the inter-level dielectric before the depositing of the first photoresist; and
    depositing a silicon anti-reflective coating over the second OPL before the depositing of the first photoresist.

11. A method of forming a double-patterned semiconductor structure, the method comprising:
    forming a plurality of contacts in a CMOS device, the forming including:
        depositing an inter-level dielectric layer over the CMOS device;
        depositing a first photoresist over the inter-level dielectric layer;
        patterning a first opening in the first photoresist, and patterning a second opening in the first photoresist;
        etching the first photoresist and the inter-level dielectric layer under conditions causing inverse reactive ion etching lag, the etching including forming a first inter-level dielectric opening and a second inter-level dielectric opening corresponding to the first opening in the first photoresist and the second opening in the first photoresist, respectively;
        removing the first photoresist;
        depositing a first organic planarizing layer (OPL) over the inter-level dielectric layer, the depositing of the first OPL including filling the first inter-level dielectric opening and the second inter-level dielectric opening;
        depositing a second photoresist over the OPL;
        patterning an opening in the second photoresist, the opening in the second photoresist located within the filled second inter-level dielectric opening;
        etching the second photoresist, the OPL, and the inter-level dielectric layer to form a third inter-level dielectric opening, the third inter-level dielectric opening being contiguous with the second inter-level dielectric opening and narrower than the second inter-level dielectric opening; and
        forming a contact in each of the first inter-level dielectric opening, the second inter-level dielectric opening, and the third inter-level dielectric opening.

12. The method of claim 11, wherein the CMOS device includes:
    an NMOS device having an NMOS gate and a PMOS device having a PMOS gate, wherein the first opening in the first photoresist is aligned with one of the NMOS gate or the PMOS gate; and
    a shallow trench isolation located between the NMOS device and the PMOS device.

13. The method of claim 12, wherein the third inter-level dielectric opening contacts the shallow trench isolation.

14. The method of claim 12, wherein the first inter-level dielectric opening contacts the NMOS gate.

15. The method of claim 12, wherein the second opening is wider than the first opening and is aligned with the shallow trench isolation.

16. The method of claim 1, further comprising:
    depositing an anti-reflective coating over the inter-level dielectric before the depositing of the first photoresist.

17. The method of claim 16, wherein the anti-reflective coating is an organic bottom anti-reflective coating (BARC).

18. A method of forming contacts in a CMOS device, the method comprising:
    providing the CMOS device including:
        an NMOS device having an NMOS gate and a PMOS device having a PMOS gate;

a shallow trench isolation located between the NMOS device and the PMOS device; and an inter-level dielectric located over the NMOS device, the PMOS device and the shallow trench isolation;

performing a double-patterning etch process on the CMOS device under conditions causing inverse reactive ion etching lag, the performing including forming a first opening, a second opening and a third opening, the second opening being wider than the first opening, and the third opening being contiguous with the second opening; and forming a first contact in the first opening and forming a second contact in both of the second opening and the third opening.

19. The method of claim 18, wherein the second contact includes a via and a plug, the via corresponding to the third opening, and the plug corresponding to the second opening.

20. The method of claim 18, wherein the first contact contacts the NMOS gate, and the second contact contacts the shallow trench isolation.

* * * * *